US008689164B2

(12) United States Patent (10) Patent No.: US 8,689,164 B2
Balabanov et al. (45) Date of Patent: Apr. 1, 2014

(54) METHOD OF ANALYTICAL PLACEMENT WITH WEIGHTED-AVERAGE WIRELENGTH MODEL

(75) Inventors: Valeriy Balabanov, Kyi (UA); Meng-Kai Hsu, Taipei (TW); Yao-Wen Chang, Taipei (TW)

(73) Assignee: National Taiwan University, Taipei (TW)

( * ) Notice: Subject to any disclaimer, the term of this patent is extended or adjusted under 35 U.S.C. 154(b) by 111 days.

(21) Appl. No.: 13/275,348

(22) Filed: Oct. 18, 2011

(65) Prior Publication Data

US 2013/0097574 A1   Apr. 18, 2013

(51) Int. Cl.
G06F 17/50   (2006.01)
(52) U.S. Cl.
USPC ........... 716/119; 716/118; 716/126; 716/132; 716/135
(58) Field of Classification Search
USPC .......................................................... 716/119
See application file for complete search history.

(56) References Cited

U.S. PATENT DOCUMENTS

| 6,671,859 B1 * | 12/2003 | Naylor et al. ................. 716/113 |
| 2009/0031269 A1 * | 1/2009 | Chen et al. ........................ 716/9 |
| 2010/0031217 A1 * | 2/2010 | Sinha et al. ..................... 716/10 |
| 2012/0054708 A1 * | 3/2012 | Alpert et al. .................. 716/122 |

OTHER PUBLICATIONS

The paper, "TSV Aware Analytical Placement for 3D IC designs, " was published at 48th Design Automation Conference (DAC), Jun. 8, 2011.
IEEE Computer Society Annual Symposium on VLSI, Chennai, India,Jul. 4-6, 2011 http://www.ieee.org/conferences_events/conferences/conferencedetails/index.html?Conf_ID=18624 http://www.eng.ucy.ac.cy/theocharides/isvlsi11/20110704_ywchang_ISVLSI.pdf.

* cited by examiner

*Primary Examiner* — Vuthe Siek
*Assistant Examiner* — Eric Lee
(74) *Attorney, Agent, or Firm* — Min-Lee Teng; Litron Patent & Trademark Office

(57) ABSTRACT

A computer-implemented method to generate a placement for a plurality of instances for an integrated circuit (IC) by utilizing a novel weighted-average (WA) wirelength model, which outperforms a well-known log-sum-exp wirelength model, to approximate the total wirelength. The placement is determined by performing an optimization process on an objective function which includes a wirelength function approximated by the WA wirelength model. The method can be extended to generate a placement for a plurality of instances for a three-dimensional (3D) integrated circuit (IC) which considers the sizes of through-silicon vias (TSVs) and the physical positions for TSV insertion. With the physical positions of TSVs determined during placement, 3D routing can easily be accomplished with better routed wirelength, TSV counts, and total silicon area.

15 Claims, 7 Drawing Sheets

METHOD OF ANALYTICAL PLACEMENT WITH WEIGHTED-AVERAGE WIRELENGTH MODEL

BACKGROUND OF THE INVENTION

1. Field of the Invention

The invention relates in general to a computer-implemented method for generating placements for integrated circuits (ICs) and, in particular, to a method for generating placements for integrated circuits (ICs) with an analytical placement algorithm.

2. Description of the Prior Art

The placement problem is to place objects into one or more fixed dies such that no objects overlap with each other and some cost metric (e.g., wirelength) is optimized. Placement is a major step in physical design that has been studied for several decades. Although it is a classical problem, many modern design challenges have reshaped this problem. The modern placement problem becomes very tough because we need to handle large-scale designs.

In modern placement algorithms, analytical placement algorithms have been shown to be most effective for large-scale IC designs. Analytical placement formulates the placement problem as mathematical programming composed of an objective function and a set of placement constraints, and then optimizes the objective through analytical approaches.

In the objective function, wirelength is one of the important factors to be optimized. A well-known half-perimeter wirelength (HPWL) model is popularly used. Since HPWL is not differentiable, it is hard to perform the optimization. Consequently, some smooth wirelength models, such as quadratic model, logarithm-sum-exponential (LSE) model, and Chen-Harker-Kanzow-Smale (CHKS) model were proposed to approximate HPWL.

However, the problem with improving analytical modeling for wirelength still induces many research challenges. Thus it is desirable to develop an accurate and effective wirelength model for analytical placement.

Furthermore, in modern IC designs, three-dimensional integrated circuit (3D IC) technology has emerged as one of the most promising solutions for overcoming the challenges in interconnect and integration complexity in modern and next generation circuit designs. The 3D IC technology can effectively reduce global interconnect length and increase circuit performance; however, this technology brings some challenges with through-silicon vias (TSVs), used to make interconnections among different dies (layers), thermal effects, packaging, power delivery/density, etc.

In a generic 3D IC structure, each die is stacked on top of another and communicated by TSVs. These TSVs are responsible for the interconnections among devices on different layers, but they could cause some significant problems. Under current technologies, TSV pitches are very large compared to the sizes of regular metal wires; as a result, a large number of TSVs will consume significant silicon areas and degrade the yield and reliability of the final chip.

In addition, TSVs are usually placed at the whitespace among macro blocks or cells, and thus TSVs might affect the routing resource and increase the overall chip or package area. The significant silicon areas occupied by TSVs and the induced yield and reliability issues become critical problems for 3D IC placement.

By reusing modern 2D placement results, a folding/stacking based 3D placement method was proposed. This method performs layer re-assignment for cells to further improve 3D placement solutions.

Another partitioning-based approach integrates wirelength, temperature, TSV counts, and thermal effect into the mini-cut objective. As known for the 2D placement problem, however, a partitioning-based approach is not as competitive as an analytical one.

Also, a multilevel analytical placement method is proposed for 3D ICs to relax discrete layer assignment so that the movements of cells are continuous in the z-direction. Its basic idea is to use an inter-layer density penalty function to remove cells between layers; however, the area occupied by TSVs is not considered during placement.

In a short summary, traditionally TSVs are inserted during the routing stage by searching whitespace in the whole 3D IC, and thus quality of a routing result strongly depends on the remaining whitespace after placement stage. However, since the sizes of TSVs are not considered during placement, the efficiency of the approaches mentioned above is usually not good enough.

To improve the deficiency, a force-directed quadratic algorithm is proposed for placing cells and TSVs in a 3D IC. In this algorithm, cells are assigned into multiple dies in a partitioning stage first, and then the placement for cells and the insertion of TSVs are carried out on each die independently for wirelength optimization. To be more specific, cells will not be moved across dies for wirelength optimization during the placement with TSVs. However, this may limit the quality of layout results.

Therefore, what is needed is a method which can places cells in a 3D IC using an effective wirelength model, along with taking the sizes of TSVs into consideration. Consequently, a high-quality layout can be generated for the 3D IC.

SUMMARY OF THE INVENTION

One object of the present invention is to generate a placement for a plurality of instances for an integrated circuit (IC) by utilizing a novel weighted-average (WA) wirelength model, which outperforms a well-known log-sum-exp wirelength model, to approximate the total wirelength.

One embodiment in the present invention determines the placement by performing an optimization process on an objective function which includes a wirelength function approximated by the WA wirelength model and a density function for evaluating the density of the plurality of instances.

Another object of the present invention is to generate a placement for a plurality of instances for a three-dimensional (3D) integrated circuit (IC) by a new placement algorithm which considers the sizes of through-silicon vias (TSVs) and the physical positions for TSV insertion.

One embodiment is to use a three-stage process for the algorithm: (1) 3D global placement with density optimization and whitespace reservation for TSVs, (2) TSV insertion and TSV-aware legalization, and (3) layer-by-layer detailed placement.

In one embodiment, the WA wirelength model is used in the global placement stage. Also, instead of using instance areas to evaluate placement density, a new density cube is introduced to model the density of 3D placement. In addition to TSV count minimization, the density introduced by the sizes of TSVs is modeled in the 3D analytical placement formulation.

Regarding the TSV insertion, an algorithm based on the overlapping whitespace area between neighboring layers is described to determine the location of every required TSV.

Since the physical positions of TSVs are determined during placement, 3D routing can easily be accomplished with traditional 2D routers with better routed wirelength, TSV counts, and total silicon area.

Other objects, technical contents, features and advantages of the present invention will become apparent from the following description taken in conjunction with the accompanying drawings wherein are set forth, by way of illustration and example, certain embodiments of the present invention.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DETAILED DESCRIPTION OF THE INVENTION

Figure 1:
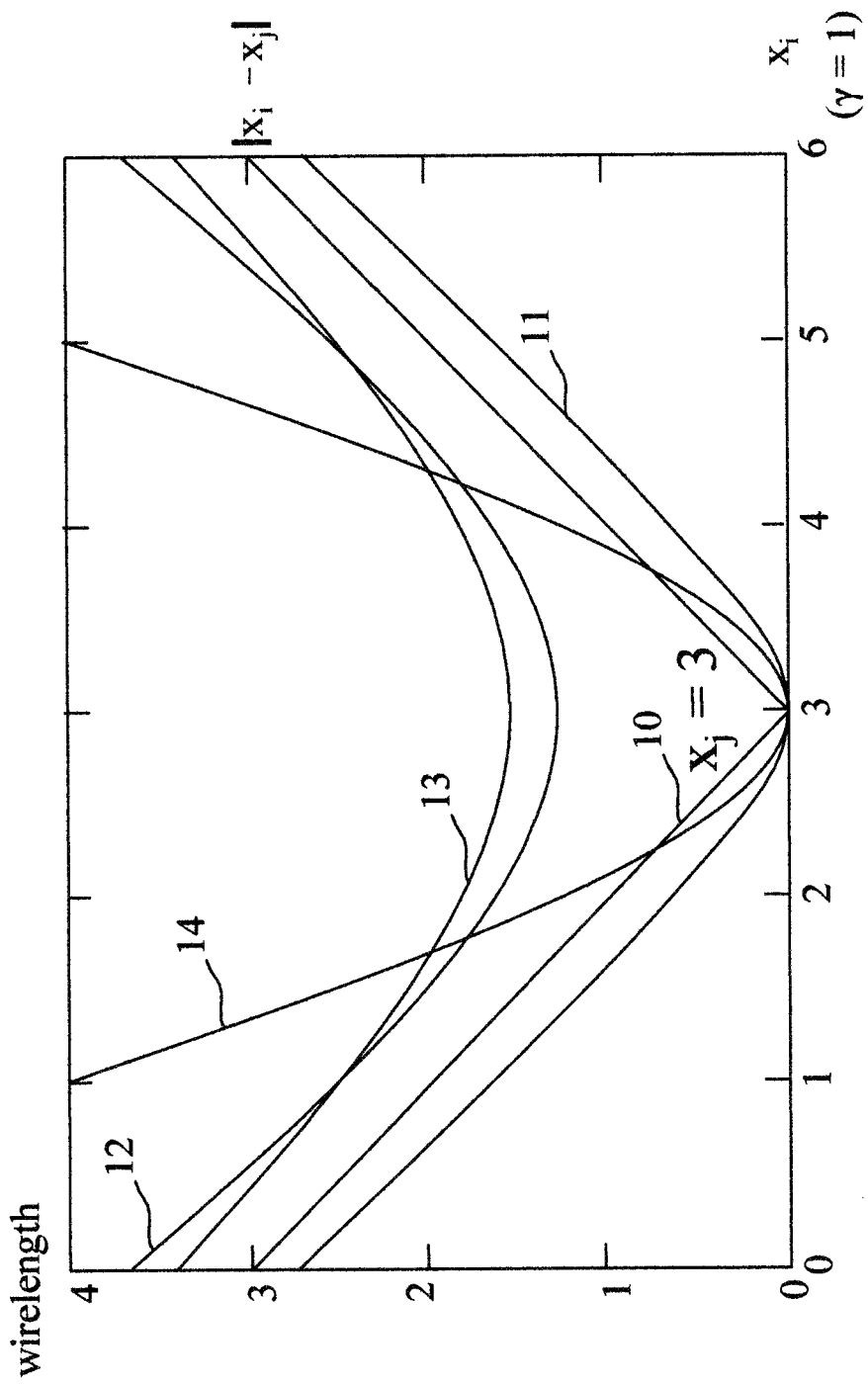
FIG. 1 illustrates a comparison chart of wirelength approximation results among several popular wirelength models as well as WA wirelength model.

The detailed explanation of the present invention is described as following. The described preferred embodiments are presented for purposes of illustrations and description, and they are not intended to limit the scope of the present invention.

Typically, the placement problem for an integrated circuit (IC) is solved in three stages (1) global placement, (2) legalization, and (3) detailed placement. Global placement evenly distributes the instances and finds the best position and layer for each instance to minimize the target cost (e.g., wirelength). Then legalization removes all instance overlaps for each layer. Finally, detailed placement refines the placement solution.

Weighted-Average (WA) Wirelength Model

In this invention, a novel weighted-average (WA) wirelength model for analytical global placement is presented.

In general, a placement problem can be formulated as a hypergraph $H=(V,E)$ placement problem. Let $V=\{v_1, v_2, \ldots, v_n\}$ represent instances, and hyperedges $E=\{e_1, e_2, \ldots, e_n\}$ represent nets. Let $x_i$ and $y_i$ be the respective x and y coordinates of the center of instance $v_i$. Given a placement region, we intend to determine the optimal positions of movable instances so that the total wirelength is minimized while satisfying the non-overlapping constraints among instances.

Therefore, the analytical global placement problem can be formulated as min $W(x,y)$, where $W(x,y)$ is the wirelength function.

In one embodiment, by dividing the placement region into non-overlapping uniform bin grids, the analytical global placement problem can be re-formulated as a constrained optimization problem:

min $W(x,y)$ s.t. $D_{b,k}(x,y) \leq M_b \forall$ bin $b$,  (1)

where $D_b(x,y)$ is the density function that calculates the total area of movable instances in bin b and $M_b$ can be computed by $M_b = t_{density}(w_b h_k - P_b)$, where $t_{density}$ is a user-specified target density value for each bin, $w_b$ ($h_k$) is the width (height) of bin b, and $P_b$ is the area of pre-placed instances in bin b.

In one embodiment, the wirelength $W(x,y)$ is defined as the total half-perimeter wirelength (HPWL), $$W(x, y) = \sum_{net\ e} \left( \max_{v_i v_j \in e} |x_i - x_j| + \max_{v_i v_j \in e} |y_i - y_j| \right) \quad (2)$$

Since $W(x,y)$ in Equation (2) is not smooth, it is hard to minimize it directly. A weighted-average (WA) wirelength model is proposed to approximate the respective maximum functions in Equations (2). Given a set of x coordinates, $x_e$, for calculating the wirelength of net e, the weighted average is given by $$\overline{X}(x_e) = \frac{\sum_{v_i \in e} x_i F(x_i)}{\sum_{v_i \in e} F(x_i)}, \quad (3)$$

where $F(x_i)$ is the weighting function of $x_i$ and is non-negative. It is intuitive that $x_{min} \leq \overline{X}(x_e) \leq x_{max}$, where $x_{max}$ and $x_{min}$ are the respective maximum and minimum values of $x_e$.

To approximate the maximum value in $x_e$, $F(x_i)$ should grow fast and can separate larger values from smaller ones. To achieve this goal, in one embodiment, an exponential function is used $$F(x_i) = \exp(x_i/\gamma), \quad (4)$$

where $\gamma$ is a pre-defined smoothing factor.

Note that other functions with a similar property to the exponential function can also be used. The estimation function for the maximum value is then defined as $$X_{max}(x_e) = \frac{\sum_{v_i \in e} x_i \exp(x_i/\gamma)}{\sum_{v_i \in e} \exp(x_i/\gamma)}. \quad (5)$$

The estimation function for the minimum value can be defined similarly. Therefore, $W(x,y)$ based on the WA wirelength model is given by $$\sum_{e \in E} \left( \frac{\sum_{v_i \in e} x_i \exp\left(\frac{x_i}{\gamma}\right)}{\sum_{v_i \in e} \exp\left(\frac{x_i}{\gamma}\right)} - \frac{\sum_{v_i \in e} x_i \exp\left(\frac{-x_i}{\gamma}\right)}{\sum_{v_i \in e} \exp\left(\frac{-x_i}{\gamma}\right)} + \frac{\sum_{v_i \in e} y_i \exp\left(\frac{y_i}{\gamma}\right)}{\sum_{v_i \in e} \exp\left(\frac{y_i}{\gamma}\right)} - \frac{\sum_{v_i \in e} y_i \exp\left(\frac{-y_i}{\gamma}\right)}{\sum_{v_i \in e} \exp\left(\frac{-y_i}{\gamma}\right)} \right).$$

FIG. 1 illustrates a comparison chart of wirelength approximation results among several popular wirelength models as well as WA wirelength model. Curves 10, 11, 12, 13, and 14 represent wirelength approximation results according to HPWL model, WA wirelength model, Chen-Harker-Kanzow-Smale (CHKS) model, logarithm-sum-exponential (LSE) model, and quadratic model respectively. The comparison is based on two variables (two instances) and calculated in one coordinate. It is shown that WA wirelength model performs well in capturing the trend of HPWL model, irrelative to the span of said two instances in said coordinate. In other words, WA wirelength model approximates HPWL model best among the shown wirelength models.

It can be shown that the WA wirelength model converges to HPWL model in Equation (2), as γ converges to 0. Besides, it can be shown that the WA wirelength model is convex in our practical usage and continuously differentiable by differentiating Equation (5) twice with respect to variables $x_i \in x_e$.

It can also be shown that the estimation error upper bound of the WA wirelength model is $$\varepsilon_{WA}(x_e) \leq \frac{\lambda \Delta x}{1 + \exp(\Delta x)/n} < \gamma \ln n, \forall n \geq 2$$

Compared with log-sum-exp (LSE) wirelength model, it can be shown that the WA wirelength model has smaller estimation errors than those of the LSE wirelength model, especially when the number of variables grows.

Next, to evaluate the placement density, overlaps among bins and instances are calculated. The density of bin b can be defined as $$D_b(x, y) = \sum_{v \in V} (P_x(b, v) P_y(b, v)), \quad (6)$$

where $P_x(b,v)$ and $P_y(b,v)$ denote the overlaps between instance v and bin b along the x and y directions, respectively. In such a way, instances can be distributed evenly among layers under the density constraints.

Since $D_b(x,y)$ is not smooth and differentiable, in one embodiment, a bell-shaped smoothing model can be used to transform the density function $D_b(x,y)$ into a smooth and differentiable function $\hat{D}_b(x,y)$ for the analytical placement.

Therefore a quadratic penalty method can be used to solve Equation (1), implying that we can perform a optimization process for an objective function as shown below, $$\min W(x, y) + \lambda \sum_b \left(\hat{D}_b(x, y) - M_b\right)^2, \quad (7)$$

where λ is a penalty coefficient.

Figure 2:
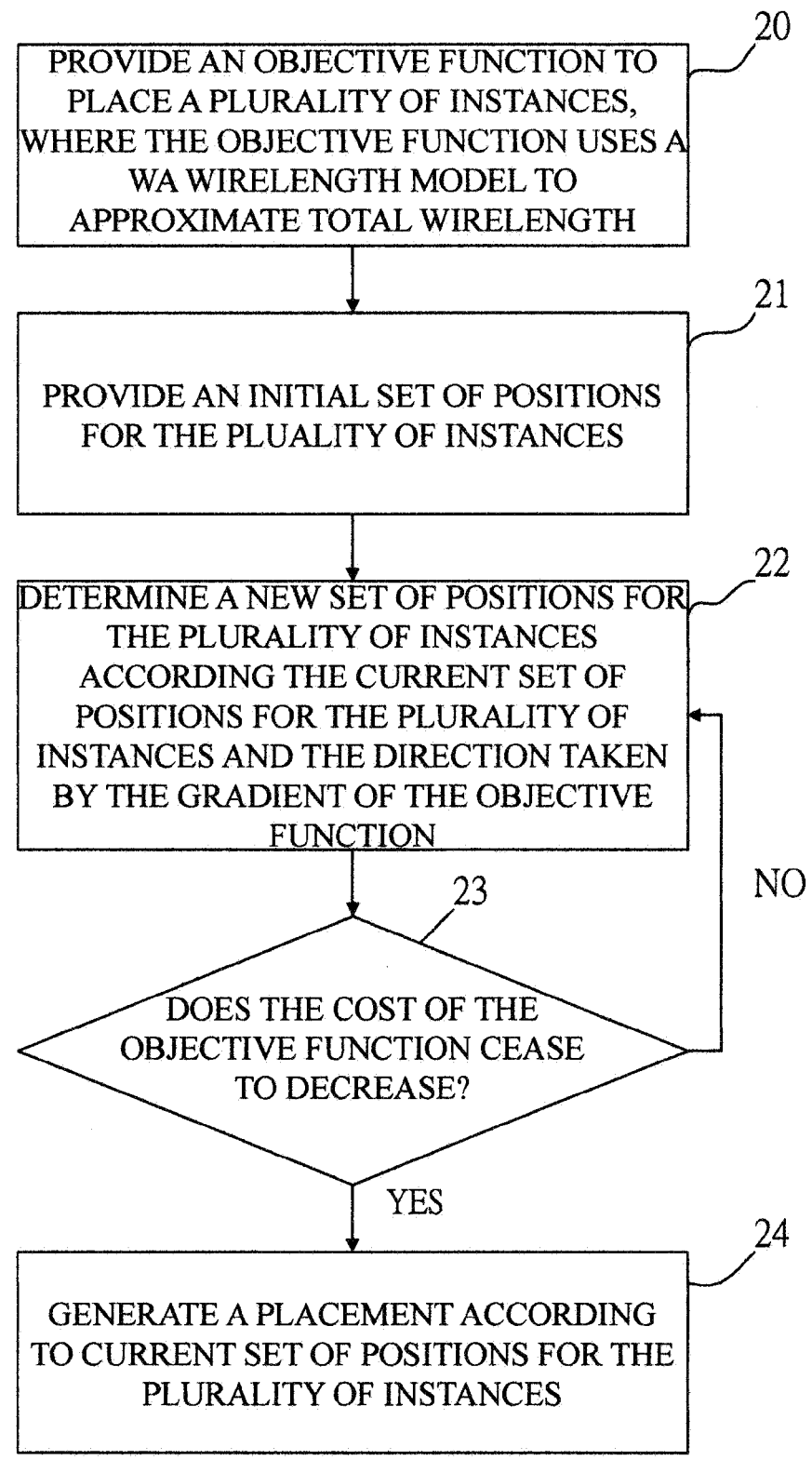
FIG. 2 is a schematic flow diagram for the analytical global placement method using weighted-averaged wirelength model.

With the objective function defined in Equation (7), please refer to FIG. 2 which depicts a schematic flow diagram for analytical global placement using the WA wirelength model.

In the beginning, a differentiable objective function is provided to generate a placement for a plurality of instances in an IC design (step 20). Next, an optimization process is used to find the solution for the minimizing the cost of the objective function.

To start the optimization process, a set of positions for the plurality of instances is chosen as an initial guess (step 21). With the current set of positions for the plurality of instances and the direction taken by the gradient of the objective function, a new set of positions for the plurality of instances can be determined (step 22). As shown, in step 23, if the cost of the objective function ceases to decrease, a solution is found; otherwise, step 22 is repeated to continue the iterations. Consequently, with the iterations executed as above, the plurality of instances are placed (step 24).

In one embodiment, the optimization process comprises utilizing the conjugate-gradient (CG) method. The details of CG method are not further described herein.

TSV-Aware Three-Dimensional (3D) Placement Using WA Wirelength Model

In another embodiment, we can extend the two-dimensional analytical placement method illustrated above to a through-silicon via (TSV)-aware three-dimensional (3D) placement method.

Figure 3:
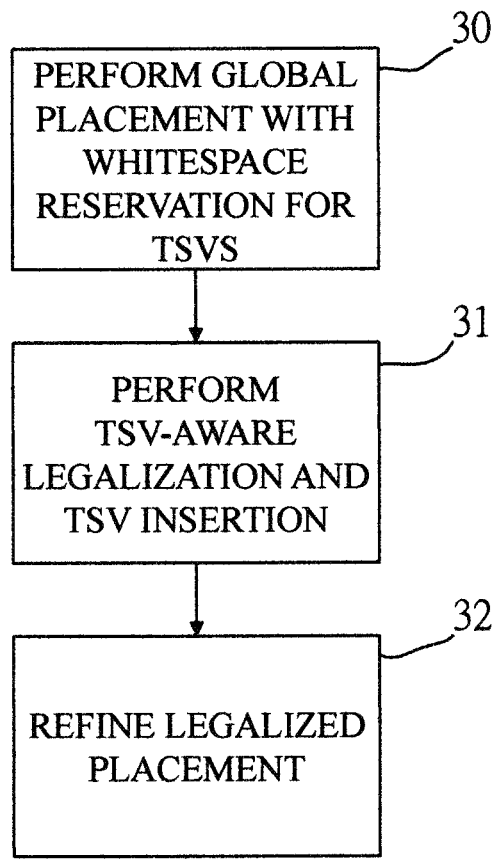
FIG. 3 is a schematic flow diagram for the analytical TSV-aware placement method.

Please refer to FIG. 3 which shows a schematic flow diagram for the analytical TSV-aware placement method. Initially, a 3D global placement is performed with density optimization and whitespace reservation for TSVs (step 30). After that, TSVs can be inserted into the reserved whitespace and TSV-aware legalization can be done (step 31). Finally, the legalized placement can be further refined (step 32).

First we focus on the details of step 30 which performs a 3D global placement with density optimization and whitespace reservation for TSVs.

Similar to the 2D global placement problem, a 3D analytical global placement problem can be formulated as a constrained optimization problem:

$$\min W(x,y) + \alpha \cdot Z(z)$$

$$s.t. D_{b,k}(x,y,z) + T_{b,k}(x,y,z) \leq M_{b,k} \forall \text{bin } b \text{ of layer } k, \quad (8)$$

where W(x,y) is the wirelength function, Z(z) is the number of used TSVs, α is a weighted number, $D_{b,k}(x,y,z)$ and $T_{b,k}(x,y,z)$ are the respective functions that are the total areas of movable instances and TSVs in bin b of layer k, and $M_{b,k}$ can be computed by $M_{b,k} = t_{density}(w_{b,k} h_{b,k} - P_{b,k})$, where $t_{density}$ is a user-specified target density value for each bin, $w_{b,k}$ ($h_{b,k}$) is the width (height) of bin b of layer k, and $P_{b,k}$ is the area of pre-placed instances in bin b of layer k. Unlike traditional 2D placers and previous 3D placers that only consider the density $D_{b,k}$ of movable instances, the sizes of TSVs are also considered in our formulation.

The wirelength W(x,y) is defined as the total half-perimeter wirelength (HPWL) as in Equation (2).

Since the exact TSV positions are unknown during global placement, the number of TSVs is approximated by the number of layers it spans. Consequently, the number of TSVs Z(z) is estimated through a similar way like wirelength:

$$W(z) = \sum_{net\ e} \max_{v_i v_j \in e} |z_i - z_j|. \quad (9)$$

For W(x,y) and W(z), the WA wirelength model can be utilized to approximate the respective maximum functions in Equations (2) and (9). The details are not described herein.

To evaluate the placement density, overlaps among bins and instances are calculated. In this invention, a 3D density model is introduced to evaluate the density of 3D placement. Adding the z dimension, rectangular bins and instances become cubes and cuboids by overlaps among cubes and cuboids instances in all the x, y and z directions. The density of a cube b of layer k can be defined as $$D_{b,k}(x, y, z) = \sum_{v \in V} (P_x(b, v, k) P_y(b, v, k) P_z(b, v, k)), \quad (10)$$

where $P_x(b,v,k)$, $P_y(b,v,k)$, and $P_z(b,v,k)$ denote the overlaps between instance v and cube b of layer k along the x, y, and z directions, respectively. In such a way, instances can be distributed evenly among layers under the density constraints.

Since $D_{b,k}(x,y,z)$ is not smooth and differentiable, in one embodiment, the bell-shaped smoothing model can be extended to transform the density function $D_{b,k}(x,y,z)$ into a smooth and differentiable function $\hat{D}_{b,k}(x,y,z)$ for the analytical placement.

Therefore a quadratic penalty method can be used to solve Equation (8), implying that we can perform a optimization process for an objective function as shown below, $$\min W(x, y) + \alpha Z(z) + \lambda \sum_{b,k} \left( \hat{D}_{b,k}(x, y, z) + T_{b,k} - M_b \right)^2, \quad (11)$$

where $\lambda$ is a penalty coefficient.

In one embodiment, the optimization process comprises utilizing the conjugate-gradient (CG) method.

Figure 4:
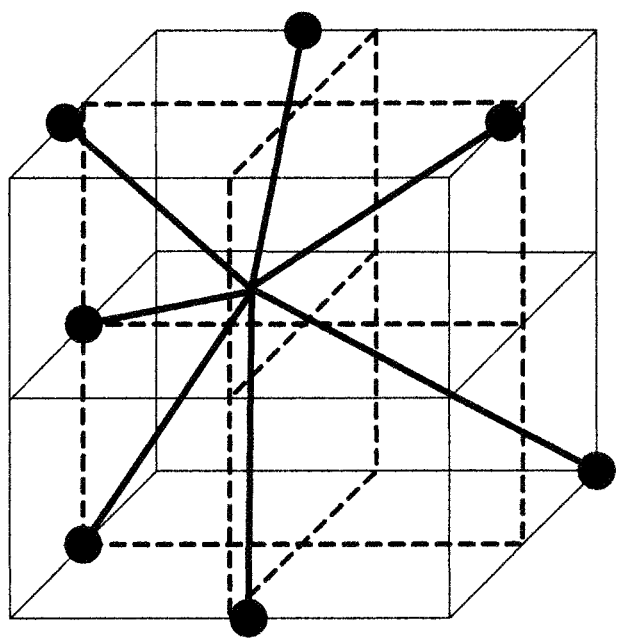
FIG. 4 demonstrates an example of net-box.

Note that, in Equation (11), since the actual positions of TSVs are not determined, $T_{b,k}$ is a dynamic value. To estimate the spaces occupied by TSVs, a reasonable assumption is that the communication between neighboring layers of a net is through one TSV. The net-box is defined as the range spanned by a net, as illustrated in FIG. 4. Just like traditional 2D routing, for a net, placing the corresponding vias inside its net-box leads to fewest routing detours. Given a net and its connected pins, we can derive its net-box. We distribute required spaces for TSVs into density cubes inside the net-box evenly, such that there are enough spaces for TSV insertion inside this net-box. After 3D analytical global placement, the amounts of whitespace needed for TSV insertion are reserved as much as possible.

Figure 5:
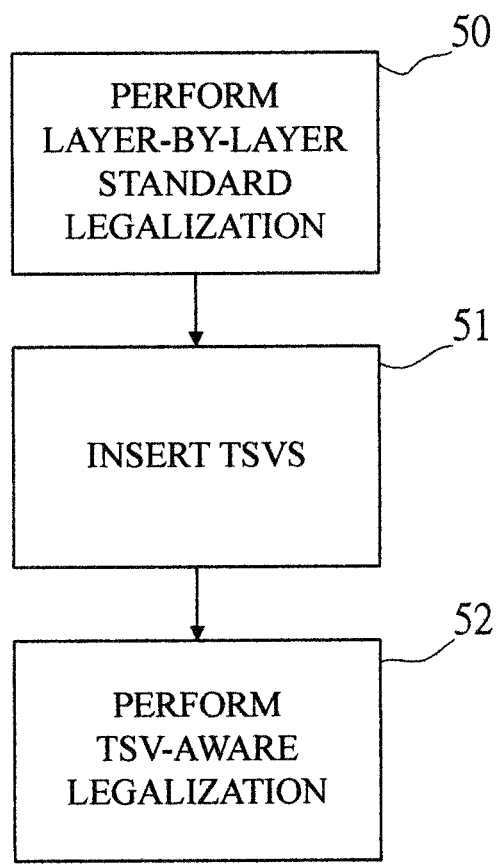
FIG. 5 is a schematic flow diagram for TSV insertion and TSV-aware legalization.

After the 3D analytical global placement is done, TSV insertion as well as legalization is performed by the following three steps as depicted in FIG. 5. First, we legalize instances in each layer with minimum displacement without considering TSVs (step 50). Second, a greedy TSV insertion method is applied to insert required TSVs while minimizing instance-to-TSV overlaps (step 51). Finally, post legalization is applied to remove instance-to-TSV and instance-to-instance overlaps with TSVs being fixed (step 52). The details of the three steps are described as follows.

First, to perform the layer-by-layer standard-instance legalization, traditional 2D legalization techniques can be applied to each layer. Unlike 2D legalization, however, connections among different layers need to be considered during the legalization for 3D ICs.

Next, given a legalized placement, we try to insert TSVs to the positions with minimum overlaps with legalized instances such that, after TSV insertion, the total movement of instances for overlap removal is minimized.

Figure 6A:
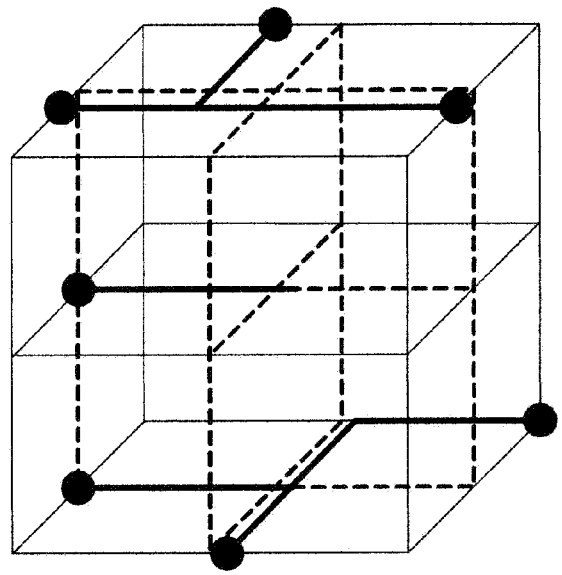
FIG. 6A and FIG. 6B shows how TSVs are inserted into a reserved space.

In one embodiment, each net is first decomposed into 2-pin nets by a minimum spanning tree (MST) algorithm, as shown in FIG. 6A. Note that all of the instances are projected to a single layer such that the geometric relation in the spanning graph is captured by the planar distance between instances. Different from the traditional spanning tree construction, TSV counts are also considered as costs for the construction. The cost of an edge e is defined as $\beta*L(e)+Z(e)$, where $L(e)$ is the planar wirelength of e, $Z(e)$ is the number of TSVs required for e, and $\beta$ and $\delta$ are user-specified parameters. In one embodiment, Kruskal's algorithm is then applied to construct a minimum spanning tree. It should be noted that, since we use only one TSV on each layer for each net, a large $\delta$ is adopted such that edges connecting between vertices in the same layer can be selected first.

Figure 6B:
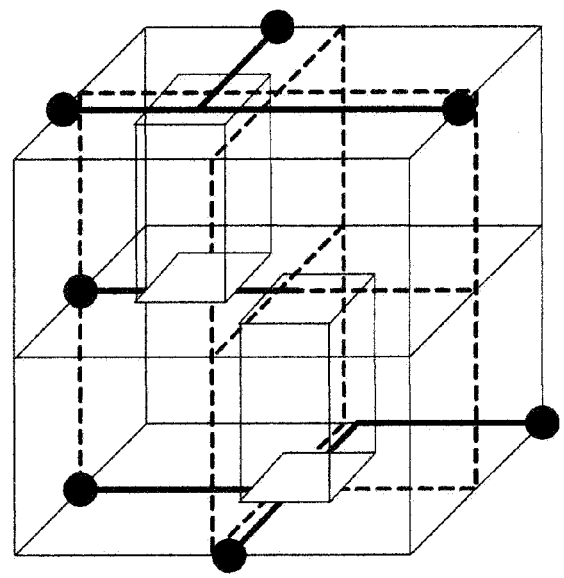

After each net has been decomposed into 2-pin nets, we start to insert required TSVs into the placement region, as shown in FIG. 6B. We sort the 2-pin nets in a nondecreasing order of their net-box sizes, and at each time, the 2-pin net with the smallest net-box is chosen for TSV insertion.

Figure 7:
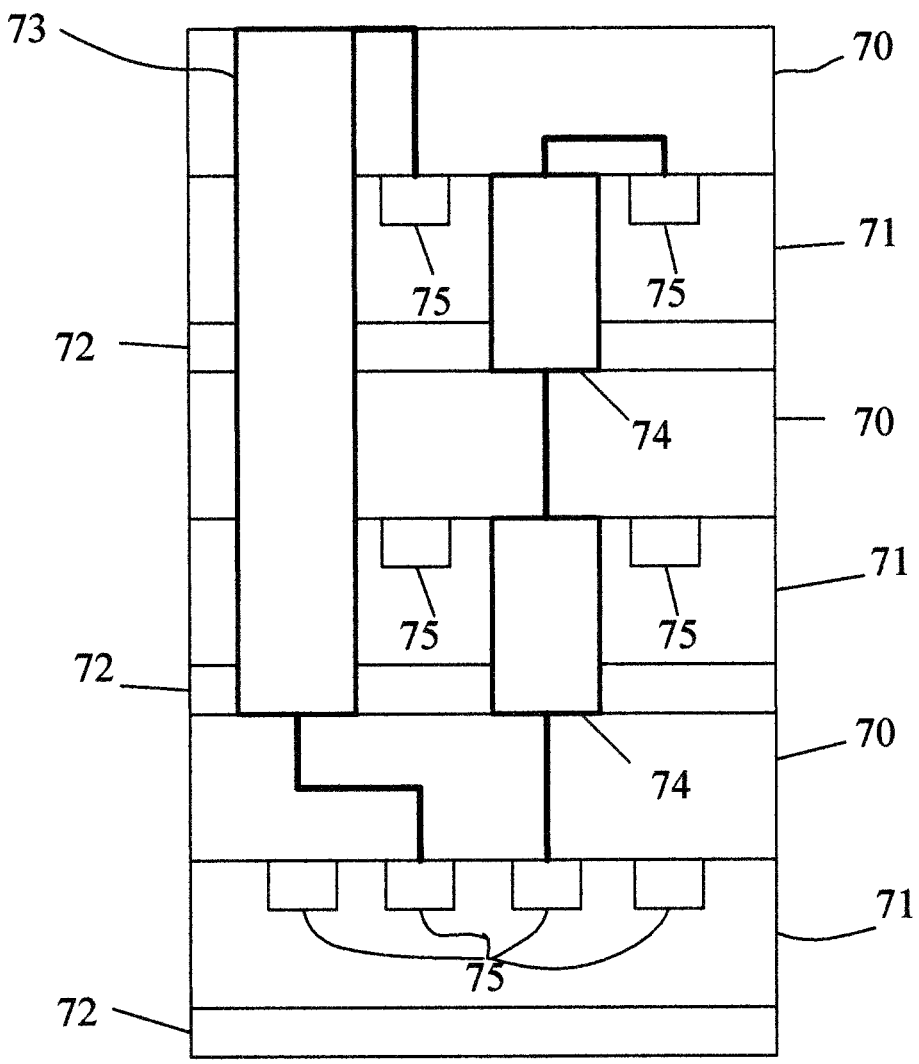
FIG. 7 shows a portion of the cross-sectional view of a three-dimensional integrated circuit (3D IC) to explain the alignment constraint of TSVs.

Here we consider the alignment constraint for TSVs. Please refer to FIG. 7 which shows a portion of the cross-sectional view of a 3D IC. 70, 71 and 72 represent metal layers, device layers and dielectric layers of the shown three stacked dies. 75 represents instances in device layers. Typically, there are two major types of TSVs, via-last TSV 73 and via-first TSV 74. As depicted in FIG. 7, via-last TSV 73 which interferes with both device layer and metal layer should be aligned between neighboring device layers, and thus are more restricted. In contrast, via-first TSVs 74 interfere with device layer only, and thus can be inserted layer-by-layer independently; with the alignment consideration of via-first TSVs, however, interconnections between TSVs of neighboring layers can be minimized.

For each net, we first evaluate the whitespace on each neighboring layer spanned by its net-box. Then, we calculate the overlapping whitespace area among these layers enclosed by the net-box. The regions enclosed by the net-box are further divided into smaller bins such that at most one TSV can be inserted into a bin. Note that, if the minimum spacing constraints for TSVs are considered, the bin size should be slightly larger than the TSV size, such that TSVs can be inserted into bins without violating the spacing constraints. After calculating the overlapping whitespace area, the TSV positions are decided by searching a bin in the enclosed region such that the overlaps between instances and inserted TSVs are minimized, and there is no overlap between any two TSVs. If there is not enough whitespace in the net-box, the searched region is doubled, and the search process continues.

Finally, after TSVs are inserted, post legalization is applied to remove overlaps between instances and TSVs. The legalization techniques presented above are applied again; at this time, however, TSVs are considered as fixed blockages when performing legalization.

After legalization with TSV insertion is done, a layer-by-layer detailed placement can be performed. Consequently, the TSV-aware 3D analytical placement process is completed with optimized routed wirelength, TSV counts, and total silicon area.

The foregoing descriptions of specific embodiments of the present invention have been presented for purposes of illustrations and description. They are not intended to be exclusive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to particular use contemplated. It is intended that the scope of the invention be defined by the Claims appended hereto and their equivalents.

What is claimed is:

1. A computer-implemented method for generating a placement for a plurality of instances in an integrated circuit (IC), wherein positions of the plurality of instances are defined according to a plurality of coordinates, wherein each position has a value in each coordinate of the plurality of coordinates, the method comprising the steps of:
   a. providing an objective function comprising a continuously differentiable weighted-average wirelength model to approximate the total wirelength for the placement, wherein the weighted-average wirelength model comprises a weighting for each value in each coordinate of the plurality of coordinates for each of the plurality of instances to derive the approximation of the maximum span in each coordinate for the plurality of instances, wherein the weighting corresponding to each value of a coordinate is respectively according to a function of the value of the coordinate only; and
   b. generating, by using a computer, the placement for the plurality of instances, by iteratively moving the plurality of instances according the direction taken by the gradient of the objective function to minimize the cost of the objective function.

2. The computer-implemented method for generating a placement according to claim 1, wherein step b comprises utilizing the conjugate gradient (CG) method.

3. The computer-implemented method for generating a placement according to claim 1, wherein the plurality of coordinates comprises x-coordinate and y-coordinate.

4. The computer-implemented method for generating a placement according to claim 3, wherein the plurality of coordinates further comprises z-coordinate.

5. The computer-implemented method for generating a placement according to claim 1, wherein the weighting for the value in each coordinate of the plurality of coordinates for each of the plurality of instances is calculated according to an exponential function.

6. The computer-implemented method for generating a placement according to claim 5, wherein the exponential function is formulated as $\exp(x_i/\gamma)$, wherein $x_i$ represents the value in each coordinate of the plurality of coordinates for each of the plurality of instances and $\gamma$ is a pre-defined smoothing factor.

7. The computer-implemented method for generating a placement according to claim 1, wherein the objective function further comprises a penalty function which includes a density function to evaluate the density of the plurality of instances, wherein the density function is formulated in terms of the overlaps between the plurality of instances and a plurality of pre-defined bins.

8. The computer-implemented method for generating a placement according to claim 7, wherein the density function is smoothed by a bell-shaped smoothing model.

9. The computer-implemented method for generating a placement according to claim 7, wherein a penalty coefficient lambda is applied on the penalty function and increased in each of the iterations.

10. The computer-implemented method for generating a placement according to claim 1, wherein the integrated circuit (IC) is a three-dimensional integrated circuit (3D IC) comprising a plurality of stacked dies, and step b further comprises iteratively moving the plurality of instances among the plurality of stacked dies with spaces reserved for through-silicon vias (TSVs) to connect instances across dies.

11. The computer-implemented method for generating a placement according to claim 10, wherein the objective function further comprises a penalty function which comprises a density function for evaluating the density of the plurality of instances and the density of through-silicon vias (TSVs) to be inserted.

12. The computer-implemented method for generating a placement according to claim 11, wherein the density evaluation of the plurality of instances in the density function is formulated in terms of the spatial overlaps between the plurality of instances and a plurality of pre-defined cubes in each die along x-coordinate, y-coordinate and z-coordinate.

13. The computer-implemented method for generating a placement according to claim 11, wherein the density of the through-silicon vias (TSVs) is evaluated by computing the spaces occupied by a plurality of net-boxes wherein each of the plurality of net-boxes is defined as the range spanned by a net across dies.

14. The computer-implemented method for generating a placement according to claim 10, further comprising the steps of:
   c. performing a layer-by-layer legalization process to the generated placement;
   d. inserting through-silicon vias (TSVs) into the legalized placement; and
   e. performing a post-legalization process to the placement with through-silicon vias (TSVs) inserted.

15. A non-transitory computer readable medium storing one or more programs for generating a placement for a plurality of instances in an integrated circuit (IC), wherein positions of the plurality of instances are defined according to a plurality of coordinates, wherein each position has a value in each coordinate, said one or more programs comprising instructions, which when executed by a computer, cause the computer to perform the steps of:
   a. providing an objective function comprising a continuously differentiable weighted-average wirelength model to approximate the total wirelength for the placement, wherein the weighted-average wirelength model comprises a weighting for each value in each coordinate of the plurality of coordinates for each of the plurality of instances to derive the approximation of the maximum span in each coordinate for the plurality of instances, wherein the weighting corresponding to each value of a coordinate is respectively according to a function of the value of the coordinate only; and
   b. generating, by using a computer, the placement for the plurality of instances, by iteratively moving the plurality of instances according the direction taken by the gradient of the objective function to minimize the cost of the objective function.

* * * * *